(12) United States Patent
Husted et al.

(10) Patent No.: US 7,522,669 B2
(45) Date of Patent: Apr. 21, 2009

(54) METHOD AND APPARATUS FOR SELECTIVE DISREGARD OF CO-CHANNEL TRANSMISSIONS ON A MEDIUM

(75) Inventors: Paul J. Husted, San Jose, CA (US); William J. McFarland, Los Altos, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 468 days.

(21) Appl. No.: 10/782,394

(22) Filed: Feb. 18, 2004

(65) Prior Publication Data

US 2004/0235439 A1    Nov. 25, 2004

Related U.S. Application Data

(60) Provisional application No. 60/449,126, filed on Feb. 21, 2003.

(51) Int. Cl.
*H04B 14/06*    (2006.01)
(52) U.S. Cl. ....................................................... 375/252
(58) Field of Classification Search ................. 375/252, 375/242, 244, 247
See application file for complete search history.

(56) References Cited

U.S. PATENT DOCUMENTS

| | | | |
|---|---|---|---|
| 5,260,974 A | | 11/1993 | Johnson et al. |
| 5,491,721 A | * | 2/1996 | Cornelius et al. ........... 375/222 |
| 5,640,677 A | | 6/1997 | Karlsson |
| 5,894,473 A | | 4/1999 | Dent |
| 5,933,420 A | | 8/1999 | Jaszewski et al. |
| 6,047,171 A | | 4/2000 | Khayrallah et al. |
| 6,226,271 B1 | | 5/2001 | Dent |
| 6,359,939 B1 | | 3/2002 | Calderone |
| 2001/0046855 A1 | | 11/2001 | Kil |
| 2002/0165004 A1 | | 11/2002 | Chen et al. |
| 2002/0183027 A1 | * | 12/2002 | Husted et al. ................ 455/219 |
| 2004/0208151 A1 | * | 10/2004 | Haverinen et al. ........... 370/338 |

* cited by examiner

*Primary Examiner*—Kevin M Burd
(74) *Attorney, Agent, or Firm*—Bever, Hoffman & Harms, LLP; Jeanette S. Harms

(57) ABSTRACT

A method and apparatus to selectively disregard co-channel transmissions on a medium uses an automatic gain control/clear channel assessment (AGC/CCA) circuit to gather signal power information, which is used to establish receiver sensitivity thresholds. Raw and cyclical power measurements of a received signal are processed by the AGC/CCA circuit to determine whether a current received signal process should be halted, and a new signal acquisition sequence begun.

42 Claims, 6 Drawing Sheets

METHOD AND APPARATUS FOR SELECTIVE DISREGARD OF CO-CHANNEL TRANSMISSIONS ON A MEDIUM

CROSS-REFERENCE TO RELATED APPLICATIONS

This application claims the benefit of priority from U.S. Provisional Application No. 60/449,126, filed Feb. 21, 2003, to Husted et al. and entitled "Method and Apparatus for Selective Disregard of Co-Channel Transmissions on a Medium", which is fully incorporated herein by reference for all purposes.

BACKGROUND OF THE INVENTION

1. Field of the Invention

Embodiments of the present invention generally relate to wireless devices and more specifically to receiving and transmitting signals between transceivers.

2. Description of the Related Art

Generally, a communication system includes a transmitter and receiver, which transmit and receive information signals over a transmission media such as wires or atmosphere. When atmosphere is used, the transmission is commonly referred to as "wireless communication." Examples of various types of wireless communication systems include digital cellular, packet data paging, wireless local area networks (LAN), wireless wide area networks (WAN), personal communication systems and others.

The capacity of a wireless communication system (i.e. the number and density of users that can be serviced) is heavily influenced by co-channel interference (CCI). CCI interference from adjacent access points (APs) and nearby mobiles represents a fundamental issue in system design and deployment. CCI occurs when signals from two access points operating on the same frequency are within a distance that allows the signals to propagate from one AP within one basic service set (BSS) to another AP within another BSS. Because the two signals are on the same channel, each AP allows both signals to pass to its respective baseband processor.

Conventionally, mitigating co-channel interference has been achieved using frequency reuse planning, and other isolation techniques that rely on the wireless medium environment.

One method for mitigating co-channel interference involves increasing the number of frequency channels available for use. When more frequency channels are available, a larger physical distance can be provided between access points using the same channel. This method may work well for wireless networks having access to a large number of channels but not as well for those with a limited number of frequency channels. For example, a wireless network operating in an IEEE 802.11a environment having as many as twelve non-overlapping channels has a distinct advantage over a wireless environment operating in an IEEE 802.11b environment where the number of non-overlapping channels is limited to three. The number of non-overlapping channels available in a given band and a given geographic region depends on government regulations and is usually difficult or impossible to change.

Increasing the distance between each BSS operating on the same channel may be used to allow the propagation loss of the transmission medium to attenuate the interfering signals to low levels. Unfortunately, as access points become denser with the proliferation of wireless devices, distances between access points decrease and thereby increases the likelihood of CCI.

Generally in IEEE 802.11 networks all wireless devices are required to operate according to the distributed coordination function (DCF) rules. All wireless devices and access points operating under these rules must perform a clear channel assessment (CCA) before transmitting. The CCA may result in one BSS waiting for signals intended for another BSS. This is referred to as CCA capture. Due to CCA capture, the available channel capacities from two BSSs operating on the same frequency channel are shared between all of the wireless devices for both BSSs thereby degrading the overall BSS throughput.

Generally, within a single BSS, all wireless devices are usually able to hear one another. However, in the case of multiple BSSs separated by some distance and on the same channel, some wireless devices within one BSS may hear messages from the interfering BSS while others do not. Therefore, the co-channel interference may preoccupy some of the wireless receivers and therefore not allow them to communicate with their own BSS thereby reducing the BSS communication efficiency. This interference may occur even if the signal strength of the arriving signal is lower than the standard-defined CCA threshold. However, once receiving a packet, most devices will attempt to receive the complete packet independent of the signal strength, source, destination or network identification addresses. This is commonly referred to as receiver capture. Both CCA capture and receiver capture may cause the throughput to degrade for some or all of the devices in a BSS. In some circumstance not all devices in a BSS are able to hear co-channel interference. In this case, a device may begin transmission to another device that is already busy receiving a co-channel interference signal.

Therefore, what is needed is a method and apparatus to configure a plurality of; adjacent wireless network circuits to operate simultaneously without reducing communication system efficiency and without increasing cost and complexity.

SUMMARY OF THE INVENTION

An aspect of the present invention is a method of selectively disregarding co-channel signals during processing of a signal having a packet thereon. The method includes receiving a signal for processing, processing the signal, determining an in-band power level of the received signal being processed and starting a signal reception sequence if the in-band power exceeds a threshold level.

An aspect of the present invention is a method of mitigating interference between desired signals and undesirable signals operating on the same channel. The method includes determining a received power profile of a desired signal and establishing a receiver signal reception threshold based on the received power profile.

An aspect of the present invention is a system for selectively disregarding signals operating on a common channel. The system includes a filter section for filtering a received digital signal to pass frequency components within a desired band of frequencies to obtain a filtered digital signal. A power detector is used for measuring in-band power of the digital signal and in-band power of the filtered digital signal. The system includes control logic configured to execute a signal search sequence, based on the measured in-band power of the received digital signal and filtered digital signal, if the in-band power levels measured exceed a threshold value.

An aspect of the present invention is a system for selectively dropping or terminating the reception of packets that are not desired, and would only serve to prevent the device from transmitting useful information. The determination of when to terminate reception can be based on the strength of the received signal, or on the partially decoded packet content including, without limitation, source, destination, or network addresses associated with the packet.

An aspect of the present invention is a system for asserting a clear channel assessment (CCA) logical TRUE status even if there is already a packet being transmitted from an overlapping BSS. This "stomping" of an existing transmission can be based on the strength of the incoming packet, or on the partially decoded packet content including, without limitation, source, destination, or network addresses associated with the packet.

An aspect of the present invention is a system for restarting the packet reception process if a significantly larger signal appears after reception of a weaker signal has begun. This ensures that devices will be able to receive packets that have been transmitted despite another packet already occupying the channel. In some circumstances not all devices in a BSS are able to hear the co-channel interference. In such a case, a device may begin transmission to another device that is already busy receiving the co-channel interference signal. By allowing that preoccupied device to restart reception with the arriving signal from its own BSS, network performance is improved. Similarly, if devices are configured to intentionally transmit over co-channel interference (described above) such transmission can be successfully received by devices that would otherwise be preoccupied with receiving the co-channel interference signal.

An aspect of the present invention is a system to disregard only co-channel data packet transmissions. Management and control packets are thereby protected, thus raising the likelihood that they may be received by all devices.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof, which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention. Generally, aspects of the present invention are described in terms of wireless RF transmission and reception devices and processes in an IEEE 802.1x regulated environment. An exemplary IEEE 802.11 wireless receiver is found in U.S. patent application Ser. No. 09/849,595 entitled "Self Correlation Detection In Automatic Gain Calibration" hereby incorporated by reference in its entirety and for all purposes. It is understood, however, that while the following detailed description of the present invention is made in the context of an IEEE 802.11a or IEEE 802.11b system, that the inventions described herein have application to many different types of communication systems, and are not limited to systems operating within the IEEE 802.11a or IEEE 802.11b standard. For example, as described hereinafter the present invention described operating upon the short and long training symbols in an IEEE 802.11a or IEEE 802.11b system, but it is noted that the teachings related thereto can be generalized to any training sequence. This training sequence may be made up of one or more sinusoids, series of modulated pulses or any other distinguishable pattern.

Figure 1:
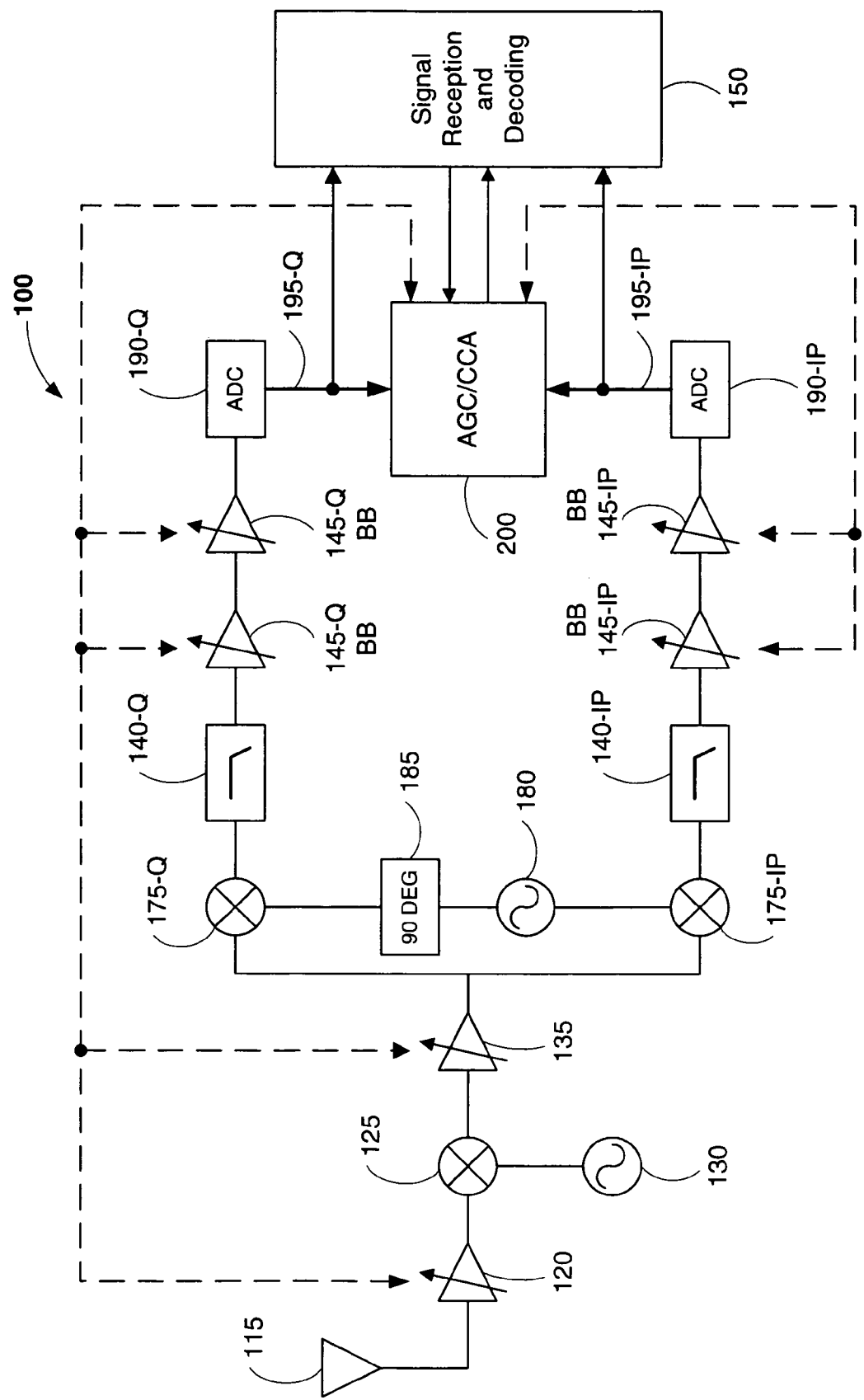
FIG. 1 is a high-level schematic diagram illustrating an embodiment of an exemplar receiver system in accordance with one or more aspects of the present invention.

FIG. 1 is a high-level schematic diagram illustrating one embodiment of an exemplar receiver 100 in accordance with one or more aspects of the present invention. Receiver 100 includes antenna 115 that receives a radio frequency (RF) signal and provides it to an RF amplifier 120. A particular channel or signal within the band is preferably selected by varying the local oscillators 130 and 180. In one aspect of the invention, the RF signal preferably conforms to the IEEE 802.11a standard, has a frequency in the 5 GHz band and is quadrature modulated to carry 6 to 54 Mbps. The signal can carry up to 54 Mbits of data and lies within one of twelve 20 MHz wide slots, or channels, eight within a 5.15-5.35 GHz band and four within a 5.75-5.85 GHz band. The signal in this embodiment is a coded orthogonal frequency division multiplexed (OFDM) signal using 52 sub-carriers spaced 312.5 kHz apart.

The receiver 100 receives an RF signal from antenna 115 and subsequently mixes the RF signal with a signal from a local RF oscillator 130 supplied to an RF mixer 125 to generate an intermediate frequency (IF) signal that is fed to an IF amplifier 135. In one aspect of the present invention, a sum of the frequencies of the local RF oscillator 130 and local IF oscillator 180 are in the range 5.15-5.35 and 5.75-5.85 GHz, with the ratio of the RF oscillator frequency to the IF oscillator frequency being 4:1. In the embodiment, the local oscillators 130 and 180 are preferably in a floating IF arrangement in which they both are variable, rather than a fixed IF arrangement where, for example, only the RF local oscillator 130 is variable.

The amplified IF signals are supplied to an in-phase mixer 175-IP and a quadrature mixer 175-Q, respectively. One of the in-phase mixer 175-IP and the quadrature mixer 175-Q is directly driven by a local IF oscillator 180, and the other of the in-phase mixer 175-EP and the quadrature mixer 175-Q is driven by the local IF oscillator signal after it is phase-shifted by a 90 degree phase shifter 185. In this way, in-phase (IP) and quadrature (O) components of the received RF signal are obtained at the outputs of the in-phase mixer 175-IP and quadrature mixer 175-Q, respectively.

The mixed IF signals pass through low-pass filters 140-IP and 140-Q to select the desired channel and remove spectrally distant components not of interest, and are amplified by two pair of series baseband amplifiers 145-IP and 145-Q. In one embodiment, low-pass filters 140-IP and 140-Q are two-pole elliptical filters having a 3 dB corner at 28 MHz. Though two baseband (BB) amplifiers are shown in each branch, a different number of amplifiers may be used. Almost any desired baseband gain step arrangement may be developed using baseband amplifiers having appropriately selected programmable gains in a particular order. Further, while the mixed IF signals are shown passing through low-pass filters 140-IP and 140-Q, it is contemplated that the BB amplifiers may include an active low pass filter. For example, BB amplifiers 145-IP and 145-Q may include an active Butterworth-type filter, and the like.

Moving from the analog to digital domain, the baseband amplifier outputs are provided to analog to digital (A/D) converters 190-IP and 190-Q, which digitize in-phase and quadrature component signals, preferably with a frequency of about 80 MHz, to a resolution of nine bits, and an input dynamic range of −500 mV to +500 mV. The A/D converters may be of virtually any suitable type such as pipeline A/D converters, and the like; however, the present invention is not so limited. For example, sigma-delta or other A/D converters may be used in their place.

An analog channel filter and/or anti-aliasing filter (neither shown) may advantageously be placed before the A/D converters 190-IP and 190-Q. In one embodiment, the combination of the analog filters performs adjacent blocker rejection of 4 dB and an alternate blocker rejection of 20 dB. With a worst case of an adjacent blocker 16 dB larger and an alternate blocker 32 dB larger, a received blocker at the A/D converter input can be 12 dB higher than the in-band signal. As is known in the art, an adjacent blocker is an interference signal adjacent to the frequency band of interest, while an alternate blocker is an interference signal farther away from the frequency band of interest.

In response to in-phase and quadrature-phase component signals, A/D converter 190-Q outputs quadrature-phase digital signal 195-Q and A/D converter 190-IP outputs in-phase digital signal 195-IP to automatic gain control/clear channel assessment (AGC/CCA) 200 whose operation with respect to the present invention will be described in greater detail below. AGC/CCA 200 analyzes the IP/Q component digital signals as described in detail below and generates gain control and channel busy signals based thereon. In one aspect, these gain control signals are provided to the amplifiers 120, 135, 145-IP and 145-Q as shown by the dashed lines in FIG. 1.

Once the signal has been detected and properly sized by the AGC/CCA logic, the signal is sent to the signal reception and decoding block 150. This block extracts the digital data, and can observe various addresses associated with the packets. In one particular embodiment, 802.11 packets include the address of the transmitter, intended recipient, and a network identifier (or BSS identifier) called the BSSID. By checking the BSSID, the signal reception and decoding block 150 can determine if a given packet is intended for any device within its own BSS, or whether the packet is co-channel interference from a different BSS.

The signal reception and decoding block 150 might also be able to tell the protocol-type of the packet (i.e., 802.11a, 802.11b, 802.11g, etc.) based on a bit field in the header of the packet. Given such a capability, it could distinguish among data frames, control frames (e.g., Request to Send, RTS, Clear to Send, CTS, etc.) and management frames (e.g., beacons, etc.), which may contain information about contention free periods.

Receiver 100 may be controlled in a hardware configuration by a state machine as described below. It is contemplated that receiver 100 may be controlled by a controller such as a micro-controller (not shown). The controller may be configured to receive and process signal detection information from the receiver 100. Generally, the controller includes central processing unit (CPU) and a memory. The CPU may be under the control of an operating system that may be disposed in the memory. The memory is preferably a random access memory sufficiently large to hold the necessary programming and data structures of the invention. While the memory may be a single entity, it should be understood that the memory may in fact comprise a plurality of modules, and that the memory may exist at multiple levels, from high speed registers and caches, to lower speed but larger direct random access memory (DRAM) chips, to programmable read only memory (PROM) chips.

Operational aspects of the invention such as the state machine operation as described below with respect to FIG. 4 may be implemented in hardware, may be implemented using a signal detection program stored in memory, or may be implemented by a combination of hardware and software. The signal detection program may use any one of a number of different programming languages. For example, the program code can be written in programmable logic controller (PLC) code (e.g., ladder logic programming), a higher level language such as C, C++, Java, or a number of other languages. While the signal detection program may be a standalone program, it is contemplated that signal detection program may be combined with other programs for use therewith.

Figure 2:
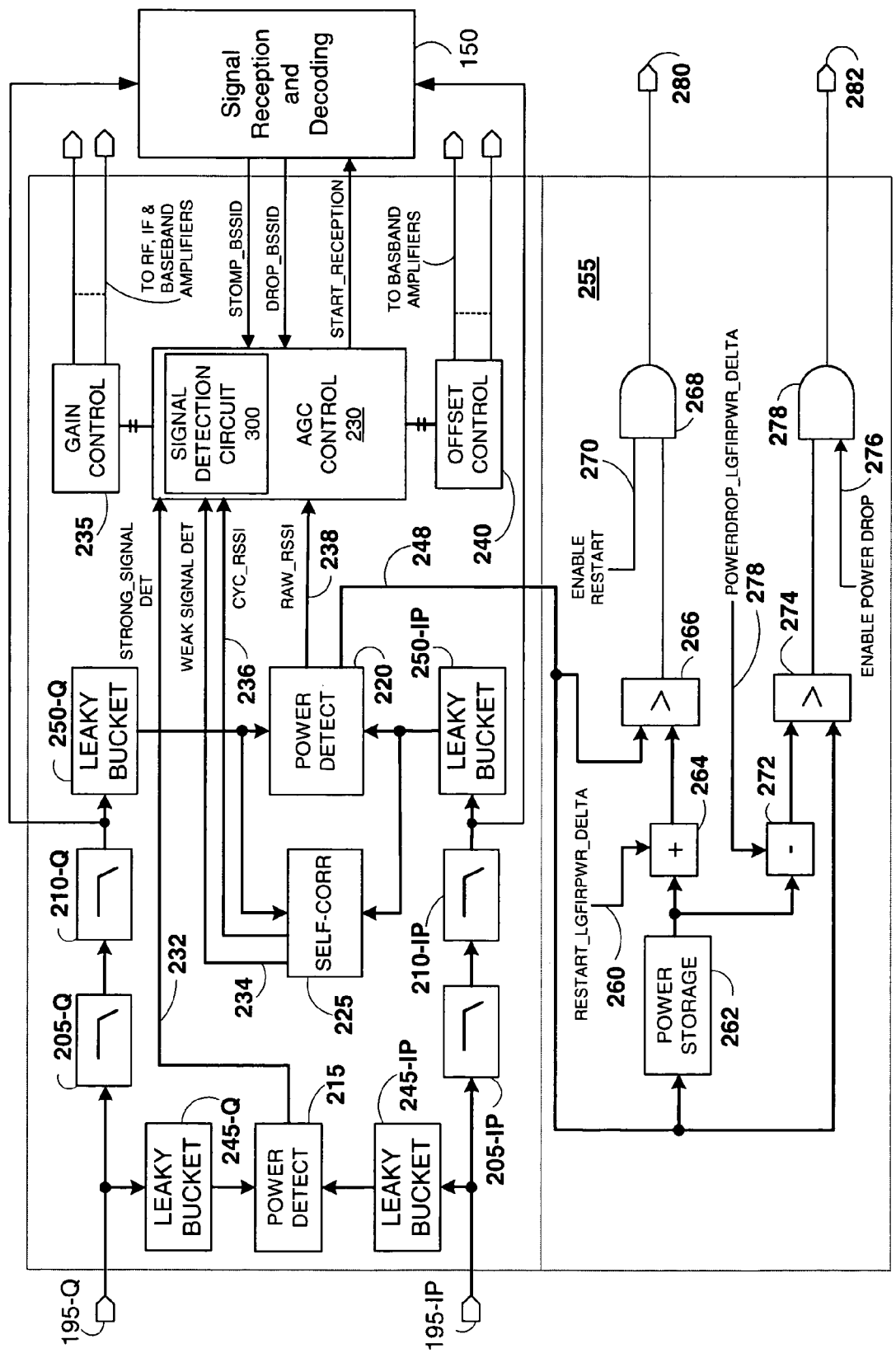
FIG. 2 is a high-level schematic diagram illustrating an embodiment of an automatic gain control circuit of FIG. 1 in accordance with one or more aspects of the present invention.

FIG. 2 is a high-level schematic diagram illustrating one embodiment of AGC/CCA circuit 200 of FIG. 1 in accordance with one or more aspects of the present invention. More specifically, the digitized IF signals 195-Q and 195-IP received from the A/D converters 190-IP and 190-Q are passed through leaky bucket filters 245-IP and 245-Q and finite impulse response (FIR) filters 205-IP, 210-IP, and 205-Q, 210-Q. Leaky bucket filters 245-Q and 245-IP provide signal data to power detector 215. In response to such data signals, power detector 215 outputs a strong_signal_detect data signal 232 to AGC/CCA control circuit 230. The first FIRs 205-IP and 205-Q are decimation filters that eliminate every other sample from their respective streams to reduce the data sampling rate from 80 MHz to 40 MHz for a normal 8.5 MHz single-sided bandwidth packet. The second FIRs 210-IP and 210-Q are standard low-pass filters that remove any residual adjacent or aliased blockers before sending the data to self-correlation processor 225 and power detector 220. The output from the second FIRs 210-IP and 210-Q can be provided to the signal reception and decoding block 150. Although this embodiment uses digital FIRs, other types of filters, including analog filters, may be used in their place. If the system is not over-sampled, the filters are preferably analog. In response to signal data received, the second FIRs 210-IP and 210-Q output signal data to leaky bucket filters 250-IP and 250-Q. Leaky bucket filters 250-IP and 250-Q filter and output a filter version of such data signals to self-correlation processor 225 and power detector 220. Self-correlation processor 225 provides weak_signal_detect data signal 234 and cyclical received signal strength indication (cyc_rssi) data signal 236 to AGC/CCA control circuit 230 in response to data signals received. In response to filtered digital signals from leaky bucket filters 250-IP and 250-Q filter, power detector 220 outputs a raw receive signal strength indication (raw_rssi) 238 to AGC/CCA control circuit 230.

AGC/CCA control logic 230 processes at least one of strong_signal_detect data signal 232, weak_signal_detect signal 234, cyc_rssi data signal 236, and raw_rssi 238, to control gain control generator 235 that outputs analog gain control signals for each of the RF amplifier. 120, the IF amplifier 135, and individual ones of the baseband amplifiers 145-IP and 145-Q. In one aspect, the AGC/CCA control logic 230 provides a control word, ten bits in length in this embodiment, to the gain control generator 235, and the gain control generator 235 generates appropriate control signals for the amplifiers. Such gain control signals are fed back to the RF amplifier 120, the IF amplifier 135 and the baseband amplifiers 145-IP and 145-Q to control the gain of each as described above. In a further aspect, the AGC/CCA might process one of a stomp_bssid signal, drop_bssid signal and start_reception signal to/from the signal reception and decoding block 150. AGC/CCA control logic 230 may control a DC offset control unit 240 to provide analog offset control signals to one or more of the baseband amplifiers 145-IP and 145-Q. DC offset control is done to ensure that the analog signals provided to the amplifiers and A/D converters 190-IP and 190-Q are properly centered and quantized. AGC/CCA control logic 230 includes a control detection circuit 300 described below.

It should be noted that although FIG. 2 shows various components within the AGC/CCA 200 to be separate from one another, it is possible that two or more units may be integrated into one. For example, the AGC/CCA control logic 230 is shown separately from the FIRs 205, 210, power detectors 215, 220 and self-correlation processor 225; however, several of these may be combined into a single processor appropriately programmed to perform these functions. Further, a programmed processor need not be used and one or more of these components can be implemented in dedicated hardware. For example, the AGC/CCA control circuit 230 may be formed from an application-specific integrated circuit.

AGC/CCA 200 includes restart circuit 255. Restart circuit 255 includes power data register 262 coupled to power detector 220 via data bus 248. Power data register 262 may be configured to store power data indicative of power detected by power detector 220. An output of power data register 262 is coupled to a digital summing circuit 264 and digital subtraction circuit 272. Digital summing circuit 264 adds digital data from power data register 262 and programmed threshold data value restart_lgfirpwr_delta 260 and outputs a resultant data signal to comparator 266. Comparator 266 includes an input coupled to data bus 248 and compares power data received from power detector 220 to data signals from digital summing circuit 264. In one embodiment, if power data received from power detector 220 is greater than the summation of restart_lgfirpwr_delta 260 and stored power data, comparator 266 outputs a data signal responsive thereto to an input of AND gate 268. AND gate 268 includes another input coupled to enable_restart signal 270 and is responsive thereto. For example, the output of comparator 266 may be selectively controlled by the logic level of enable_restart signal 270. AND gate 268 outputs a restart signal 280 responsive to input signal levels.

Digital subtraction circuit 272 subtracts programmed threshold data value powerdrop_lgfirpwr_delta 278 from power data register 262 and outputs a resultant data signal to comparator 274. Comparator 274 includes an input coupled to data bus 248 and compares power data received from power detector 220 to data signals received from digital subtraction circuit 272. In one embodiment, if power data received from power detector 220 is less than the subtraction of powerdrop_lgfirpwr_delta 278 from stored power data, comparator 274 outputs a data signal responsive thereto to an input of AND gate 278. AND gate 278 includes another input coupled to enable power drop signal 276. AND gate 278 outputs power_drop signal 282 responsive to input signal levels. Therefore, during operation, restart circuit 255 reacts to an in-band power change either in the positive direction due to a increase in in-band power or in a negative direction due to a sudden in-band power drop.

Figure 3:
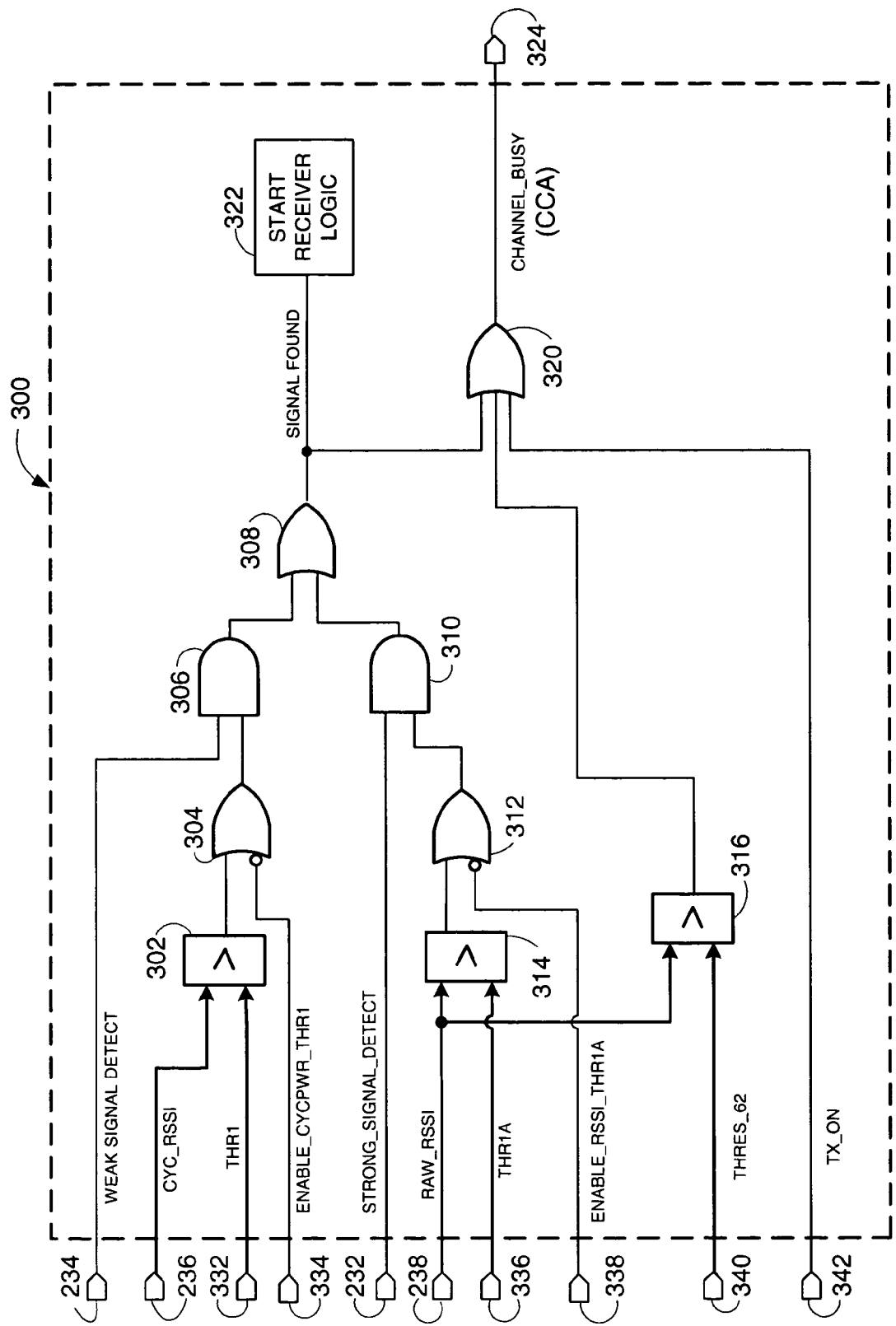
FIG. 3 is a high-level schematic diagram illustrating an embodiment of a signal detection circuit of FIG. 2 in accordance with one or more aspects of the present invention.

FIG. 3 is a high-level schematic diagram illustrating one embodiment of a signal detection circuit 300 of FIG. 2 in accordance with one or more aspects of the present invention. Signal detection circuit includes comparator 302. Comparator 302 receives and compares data signal cyc_rssi 236 to data signal thr1 332, and is logic high if data signal cyc_rssi 236 is greater than data signal thr1 332. Data signal thr1 332 may be set near the noise floor of the receiver 100 to allow for a wide receiver capture range for packets. An output of comparator 302 responsive to the comparison of data signal cyc_rssi 236 and data signal thr1 332 is coupled to an input of OR gate 304. A data signal enable_cycpwr_thr1 334 is coupled to a negated input of OR gate 304. AND gate 306 outputs a data signal responsive thereto to an input of OR gate 308 in response to weak signal detection data signal 234 and an output signal of OR gate 304. In operation, when weak signal detection signal 234 and enable_cycpwr_thr1 334 are enabled and cyc_rssi 236 exceeds data signal thr1 332, AND gate 306 outputs a logic high signal to OR gate 308. OR gate 308 outputs a logic signal indicative thereof to start receiver logic 322 and provides an input to OR gate 320.

Signal detection circuit 300 includes comparator 314. Comparator 314 includes an output coupled to an input of OR gate 312. Such output of comparator 314 is responsive to data signal raw_rssi 238 and data signal thr1a 336, and is logic high if data signal raw_rssi 238 is greater than data signal thr1a 338. OR gate 312 has an output coupled to an input of AND gate 310. OR gate 312 also receives enable_rssi_thr1a signal at a negated input. AND gate 310 outputs a data signal responsive thereto to an input of OR gate 308 in response to strong signal detection data signal 232 and an output signal of OR gate 312. In operation, when strong signal detection signal 232 and enable_rssi_thr1a 338 are enabled and raw_rssi 238 exceeds data signal thr1a 336, AND gate 310 outputs a logic high signal to OR gate 308.

Signal detection circuit 300 includes comparator 316. Comparator 316 receives raw_rssi data signal 238 and compares that to thres_62 data signal 340, and is logic high if data signal raw_rssi 238 is greater than data signal thres_62 340. Comparator 316 outputs a comparison signal to an input of OR gate 320 responsive to data signals input thereto. OR gate 320 outputs a channel_busy signal 324 in response to an output of OR gate 308, or an output of comparator 316. OR gate 320 also outputs a channel_busy (CCA) signal 324 in response to the logic state of tx_on signal 342 as described in further detail below.

AGC/CCA Operation

In the embodiment, the AGC/CCA control logic 230 first checks to see if the signal is sufficiently saturating either of the A/D converters 190-IP and 190-Q. If so, a quick drop gain control procedure is executed. Next, the AGC/CCA base gain control logic 230 determines whether the received signal is within a defined range. If so, no gain control is needed; otherwise, a gain control procedure is executed. Then, the AGC/CCA system 200 attempts to identify an in-band signal using strong signal and weak signal detection techniques, as described below. If an in-band signal is found, the detection process is complete; if not, the detection process is repeated on the next portion of the signal. Weak signal detection and strong signal detection may be independent and complementary features. As described further herein, for strong signal detection, it is determined that a signal may exist by the arrival of a stronger signal necessitating a drop in receive gain, whereas for weak signal detection, it is determined that a signal may exist due to a sudden increase in measured in-band power at least proportional to the increase in total power at the AGC/CCA 200 (while not requiring a gain change), followed shortly by a self-correlation exceeding thresholds. It is noted that it is preferable to disable weak signal detection, typically for a few microseconds, if a gain change is made, since self-correlation will not be valid until the entire viewing window for self-correlation is filled with post-gain-change values. Thus, weak-signal detection is used for arriving signals not large enough relative to blockers or noise to cause gain changes, and strong signal detection for larger arriving signals. For strong signal detection, new signal arrival is determined based upon whether a coarse gain drop or quick drop in gain results. Also, for other preamble types, self-correlation can be replaced with cross-correlation or other techniques based on preamble structure.

In operation, the AGC/CCA 200 adjusts receiver gains so that the received signal can properly be quantized by the A/D converters 190. If this signal is too big at the A/D converter inputs, the signal will be distorted by saturation. If the signal is too small at the A/D converter inputs, the quantization noise of the A/D converters 190 will render the received signal-to-noise (S/N) ratio too low for correct detection. For this purpose, the AGC/CCA control logic 230 digitally controls the analog variable gain stages mentioned above using the gain control unit 235.

Strong Signal Detection

Any time a coarse gain drop or quick gain drop as described above occurs, a flag strong signal is set by the AGC/CCA control logic 230. This flag remains high until the signal is determined to be in range at the A/D converters. At this point, flag_relpwr is calculated. Flag_relpwr is an empirical threshold variable related to the absolute digital size of the in-band signal relative to the absolute total digital signal at the A/D converters. Thus, when flag_relpwr is high and strong signal is high, the strong_signal_detect flag is asserted. In other words, if the signal is deemed to be an in-band signal, because most of its energy is within the bandwidth of the digital filter, then strong signal detection is asserted. From here, if enable_rssi_thr1$a$ is asserted and raw_rssi is greater than thr1$a$, or if enable_rssi_thr1$a$ is not asserted, then the flag signal_found is asserted. Then, a fine gain change is made and the AGC/CCA process is completed once the number of consecutive gain changes is equal to or greater than the minimum number of gain changes deemed to constitute a successful AGC/CCA operation (i.e., when there have been enough gain changes to ensure a full programmable amplifier ramp-up when the receiver 100 is turned on). In summary, if a course gain drop or quick gain drop is detected, the signal is determined to be in-band, and raw_rssi 238 is greater than data signal thr1$a$ 336 (only necessary if enable_rssi_thr1$a$ 338 is asserted). Once signal_found is asserted, the AGC/CCA 200 sizes the signal to be in-range, and then asserts AGC/CCA_done to pass the signal along to the appropriate decoder.

Weak Signal Detection

In weak signal detection, the normalized self-correlation of short sequences is measured to look for anything in-band with a periodicity of about 0.8 microseconds. This is a two-step process performed concurrently with the above-described strong signal detection process. First, the system waits for the normalized self-correlation as measured by the self-correlation processor 225 to exceed a first normalized self-correlation magnitude threshold value m1thres. Second, the self-correlation processor 225 measures self-correlation of, for example, 802.11a packets by taking 32 samples in a short training symbol at the beginning of a packet and comparing each of the samples to a corresponding sample from the preceding short training symbol. While aspects of the invention are described in terms of self-correlation for OFDM, a similar system with cross-correlation or some other weak detection mechanism could be used in a similar way. For example, for IEEE 802.11b environments, the same system may be used for weak detection by substituting Barker sequence cross-correlation for OFDM self-correlation. In this case, a barker_rssi takes the place of cyc_rssi, and enable_cycpwr_thr1 is similarly used.

Detecting when the self-correlation output exceeds m1thres can thus detect the existence of an incoming packet; however, it would also detect interferers, since they can have structures that can also self-correlate. For this reason, the embodiment employs an additional test. Once the normalized self-correlation exceeds m1thres, the system enters a loop and for m1count_max cycles counts in a variable m1tally the number of times the normalized self-correlation exceeds a second normalized; self-correlation magnitude threshold value m2thres, where m2thres is less than or equal to m1thres. If m1tally is greater than m2count_thr, a threshold of the count of normalized self-correlation is greater than m2thres, before m1count_max (a window length for the self-correlation count) cycles have elapsed, weak signal detection may be detected. Subsequently, if enable_cycpwr_thr1 is asserted and cyc_rssi is greater than enable_cycpwr_thr1, or if enable_cycpwr_thr1 is not asserted, then the flag signal_found is asserted. Then, similar to after strong signal detection, a fine gain change is made and the AGC/CCA process is completed once the number of consecutive gain changes is equal to or greater than the minimum number of gain changes deemed to constitute a successful AGC/CCA operation (i.e., when there have been enough gain changes to ensure a full programmable amplifier ramp-up when the receiver 100 is turned on).

As noted above, the windowing technique based on m1count_max is used because both interferers and noise may have a self-correlation that momentarily exceeds a threshold, but the chances of this occurring diminish when windows of samples obtained over consecutive periods of time are used. For example, a subsequent window will contain many of the same samples as the previous window, but the previous window will not contain the most recent sample from the subsequent window, and the subsequent window will not contain the oldest sample from the previous window. Thus, for example, if two 802.11a symbols in adjacent channels are sent, such that they are separated in frequency by 20 MHz, the last 0.8 microseconds of the first symbol will exactly match the next 0.8 microseconds guard period of the next symbol, creating self-correlation, but this spike will rapidly fade, in comparison with a preamble where a flat normalized self-correlation result is expected for the preamble duration.

Thus, aspects of the invention provide a way of performing a two-threshold windowing process on a self-correlation measurement. One threshold is used to determine that a signal may be present in-band, and the number of times a second threshold is exceeded in different windows of offset samples is counted to further determine if that in-band signal is a desired signal. This is done to combat temporary correlation of thermal noise as well as to combat self-correlation during the data segment of an interferer. An exemplar weak detection method may be used as described in U.S. patent application Ser. No. 09/849,595 entitled "Self Correlation Detection In Automatic Gain Calibration" hereby incorporated by reference in its entirety and for all purposes. In summary, if a normalized self-correlation is high enough, and the signal appears in-band, and if cyc_rssi data signal 236 is greater than data signal thr1 332 (only necessary if enable_cycpwr_thr1 data signal 334 is asserted), weak signal detection and signal_ found are asserted.

Restart Operation

Referring to FIG. 2, in another aspect of the present invention, AGC/CCA 200 aborts the reception of a packet while the receiver 100 is receiving such packet when a new stronger signal is detected. In this embodiment, AGC/CCA 200 measures the in-band power at the beginning of a new packet and provides this to restart circuit 255. If the power change from such measured power exceeds restart_lgfirpwr_delta data signal 260 and if enable restart 270 is set, comparator 266 outputs a signal indicative thereof to AND gate 268. AND gate 268 asserts a restart signal 280. Once restart signal 280 is asserted a gain change will be set by gain control 235 based on the last measured power detection from power detector 220 and a strong signal detection sequence such as described above begins.

In another aspect, AGC/CCA 200 reports a power drop error if an in-band power measurement if a received signal drops quickly. For example, if a power drops exceeds power-drop_lgfirpwr_delta data signal 278 and enable power drop signal 276 is set, AND gate 276 outputs a logic high data signal 282. Subsequently, AGC/CCA 200 resumes a weak signal search mode.

Detection Circuit Operation

During operation, data signals 195-Q and 195-IP are processed by the AGC/CCA 200 to detect a strong signal via power detector 215, and to find the raw power received signal strength indication (RSSI) from power detector 220. The power detector 215 estimates the total digitized power at the A/D converters 190-IP and 190-Q by, for example, summing a window of instantaneous power calculations for half of a preamble short symbol window in an 802.11a signal (400 nanoseconds) for a total of 16 samples.

Outputs of leaky buckets 250-IP and 250-Q are also processed by self-correlation processor 225 to output a weak signal detection data signal 234 and cyclical RSSI power data signal 236 that is correlated to a preamble of a received signal. Raw power RSSI data signal 234 and cyclical RSSI power data signal 236 incorporate a receiver 100 gain setting and noise calibrations such that they are about accurate on an absolute basis in decibels (dB) and represent the approximate signal to noise ratio (SNR).

To capture the weakest of signals, weak signal detect data signal 234 is used, and cyclical RSSI power data signal 236 is compared to data signal thr1 332 if enable_cycpwr_thr1 is enabled. Generally, the data signal thr1 332 is set near the noise floor of receiver 100 to get the best sensitivity. However, data signal thr1 332 may be set to virtually any level as needed to alter the reception sensitivity of receiver 100.

A large foreign signal such as a radar signal may overload the receiver 100 causing strong_signal_detect signal 232 to be logic high. In this case, the radar signal would not have a preamble and therefore would be rejected once the receiver 100 determines that it is an undesirable signal. One exemplar method used to detect a radar signal is described in U.S. patent application Ser. No. 10/138,953 entitled "Method and Apparatus for Physical Layer Radar Pulse Detection and Estimation" hereby incorporated by reference in its entirety and for all purposes. In this embodiment, a strong signal detection sequence may be used as described herein to facilitate a restart sequence. For example, consider the case where the AGC/CCA 200 detects a radar signal that saturates the A/D converters 190-Q and 190-IP while a packet is being processed. In this case, the AGC/CCA control logic 230 will initiate a strong signal detection sequence. Accordingly, as the received signal is a radar signal there will be no preamble, the AGC/CCA control logic 230 will reject the radar signal and the AGC/CCA will assert a radar signal found flag. The AGC/CCA will subsequently resume searching for a signal packet. As a further enhancement to the radar detection scheme, the size of the radar signal will be calculated as the size of the radar pulse above the currently received signal added to the recorded RSSI of the received signal, in dB. In this way, the radar detection algorithm can accurately measure the strength of pulses in the same way as it would if it were beginning from the noise floor.

If a weak signal is found via the normalized self-correlation exceeding a given threshold, and there is a crossing of cyc_rssi signal 236 over thr1 data signal 332 (only required if enable_cycpwr_thr1 is asserted), OR gate 308 outputs a logic high signal indicative thereof. Also, if a large jump in received power is detected in power detect block 215 and raw_rssi data signal 238 crosses the threshold data signal thr1a 336 (only required if enable_rssi_thr1a is asserted), OR gate 308 outputs a logic high signal indicative thereof. Accordingly, OR gate 308 outputs such logic high signal to start receiver logic 322 to activate a signal reception sequence; such as described below with reference to FIG. 4. When a signal is found OR gate 308 also outputs a logic signal indicative thereof to OR gate 320. OR gate 320 outputs channel_busy signal 324 in response to such input signal logic. In one aspect of the operation of the signal detection circuit, thres_62 data signal 340 is compared by comparator_316 to raw_rssi data signal 238. If raw_rssi data signal 238 exceeds thres_62 data signal 340, comparator 320 outputs a logic high signal indicative thereof to OR gate 320. OR gate 320 outputs a channel_busy signal 324. The tx_on data signal 342 may be used to activate the channel_busy signal 324 to flag receiver 100 that a transmitter is transmitting and therefore prevent signal reception sequence. Therefore, channel_busy signal 324 may be asserted when a signal is found, raw_rssi data signal 238 exceeds a value of thres_62, or tx_on data signal 342 is asserted. In this way, if there is a chance that a signal is on the medium, either because the receiver 100 or transceiver is receiving a signal, transmitting a signal, or detecting large in-band power, therefore, a transceiver will be set to not transmit a new packet.

In one aspect, once the signal reception sequence is started, the AGC/CCA 200 only looks for power drops or a restart sequence. Generally, the power values and state of threshold comparisons effectively remain constant until the reception sequence is ended, unless other events occur such as, CCI, restarts, power drops, radar, noise, and the like. Accordingly, the reception sequence may be ended in a plurality of ways such as by reaching the end of a packet, aborting a packet if it does not conform to a proper preamble, restart is initiated, power drop, and the like.

In one embodiment, the receiver 100 adapts data signal thr1 332, data signal thr1a 336, and data signal thres_62 340, and other thresholds to conform to the environment. For example, the receiver may be configured to ignore weak co-channel interference (CCI) signals. In another case, the thresholds may be set to ignore higher levels of CCI by increasing data signal thres_62 340. Additionally, data signal thres_62 340 may be increased to increase the ability for transmitters to transmit to receiver 100 more easily to avoid CCA capture. Further, increasing data signal thr1a 336 and data signal thr1 332 may be used to avoid both receiver capture and CCA capture. In one aspect based on the measured power data of the BSSIDs, the AGC/CCA 200 may choose to ignore some or all packets from a foreign BSSID by setting all thr1a 336, thr1 332, thres_62 340 in between desired BSSID RSSIs and undesirable BSSID RSSIs. In a more complicated scheme, a less sensitive group of settings for thr1a 336 may be used only when a transceiver having a receiver 100 is placed in a transmit mode. In this way, transmit is accomplished without deferring to co-channel signals. When the transceiver has nothing to transmit, it could revert to the standard settings, which do not degrade performance, while asserting enable_restart 270. In this more sensitive mode, the receiver 100 may detect newly arriving members of its BSSID or those that had drifted into having lower RSSI values while still being able to use restart capability to discard a foreign (undesired) packet if a desired one arrived.

Figure 4:
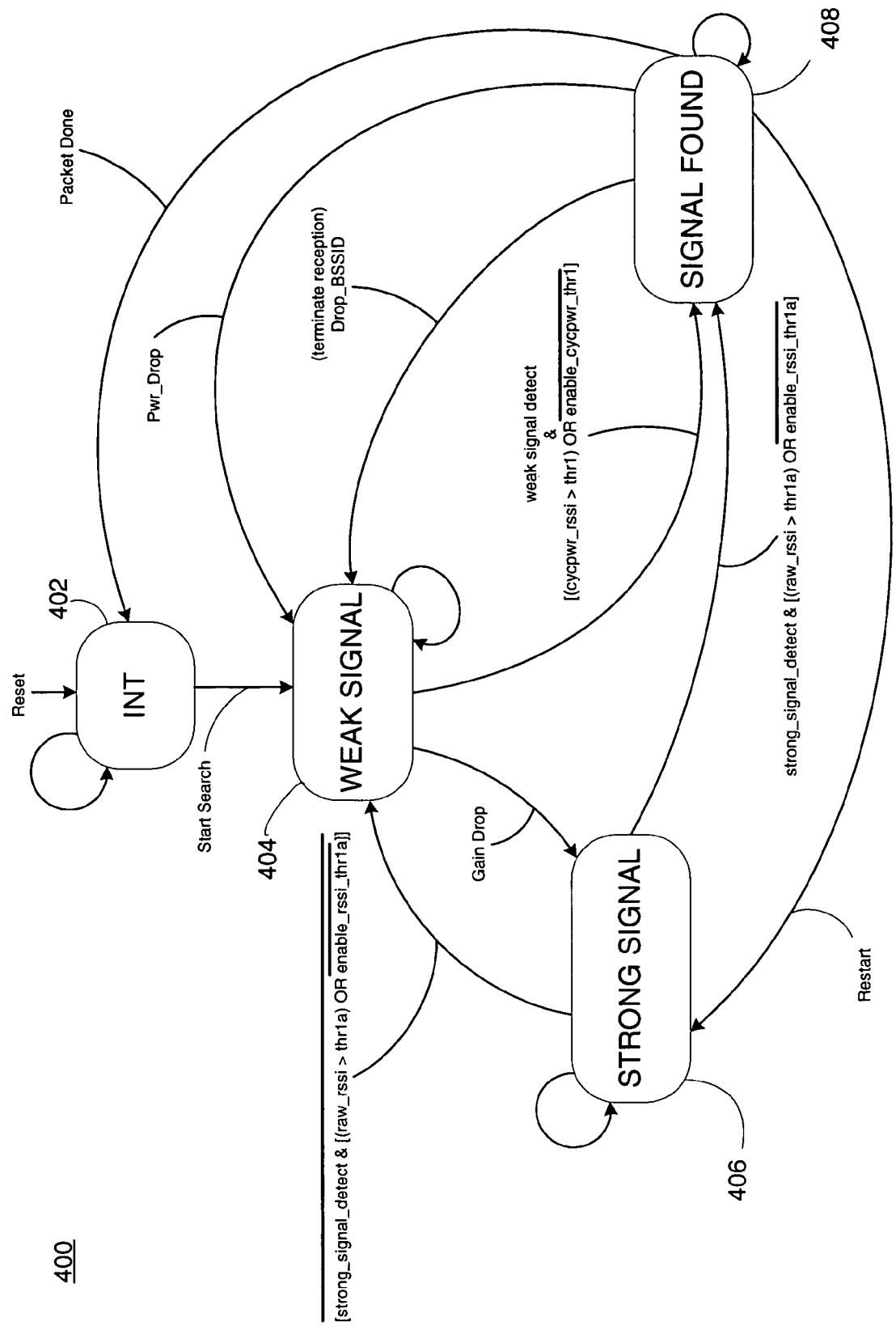
FIG. 4 is a state-diagram illustrating one method for initiating a restart sequence for signal capture for use with aspects of the present invention.

FIG. 4 is a state-diagram illustrating one embodiment of a method 400 for initiating a signal search sequence for use with aspects of the invention. Method 400 is entered into; for example, when signal detection program is activated. At 402 AGC/CCA 200 is in an initial condition. When a search sequence is activated to search for a packet at 404 method 400 sets AGC/CCA 200 to a weak signal detection mode. At 404 if weak_signal_detect data signal 234 is enabled and cyc_rssi data signal 236 is greater than data signal thr1 332 (if enabled), or enable_cycpwr_thr1 data signal 334 is not enabled, AGC/CCA 200 is set to signal found mode at 408. At 404 if a gain drop is detected by AGC/CCA 200, method 400 proceeds to 406 and a strong signal detection sequence is started. The gain drop may be initiated by a new signal being received by the receiver 100. The gain is adjusted by the AGC/CCA 200 to better quantize the received signal so that it can be determined what kind of signal it is, such as OFDM, complimentary code keying (CCK), and the like, and decoded properly. At 406 when, either, raw_rssi data signal 238 is not greater than data signal thr1a 336 and enable_rssi_thr1a is logic high, or, strong_signal_detect data signal 232 is logic low, method 400 proceeds to 404.

Still referring to FIG. 4, at 406 when raw_rssi data signal 238 is greater than data signal thr1a 336 or enable_rssi_thr1a data signal 338 is not enabled and strong_signal_detect data signal 232 is logic high, method 400 proceeds to 408. At 408 when a signal is found, if restart circuit 255 initiates a restart sequence, method 400 initiates a strong signal detection sequence at 406. In this way, if a new, larger in-band signal is detected on top of a pre-existing packet, AGC/CCA 200 will immediately begin changing the gain and attempting to process the new, large input. If restart circuit 255 detects an in-band power drop, method 400 returns to 404. In this case, AGC/CCA 200 has detected the early loss of in-band energy, so it may return to the base search state and begin looking for a new packet. If the signal reception and decoding block 150 determines that the packet has one or more characteristics, including but not limited to a foreign BSSID, method 400 returns to 404 (terminate reception). At 408, AGC/CCA 200 is set to signal found mode and remains there until the packet has been received, aborted, etc., and then returns to 402.

Figure 5:
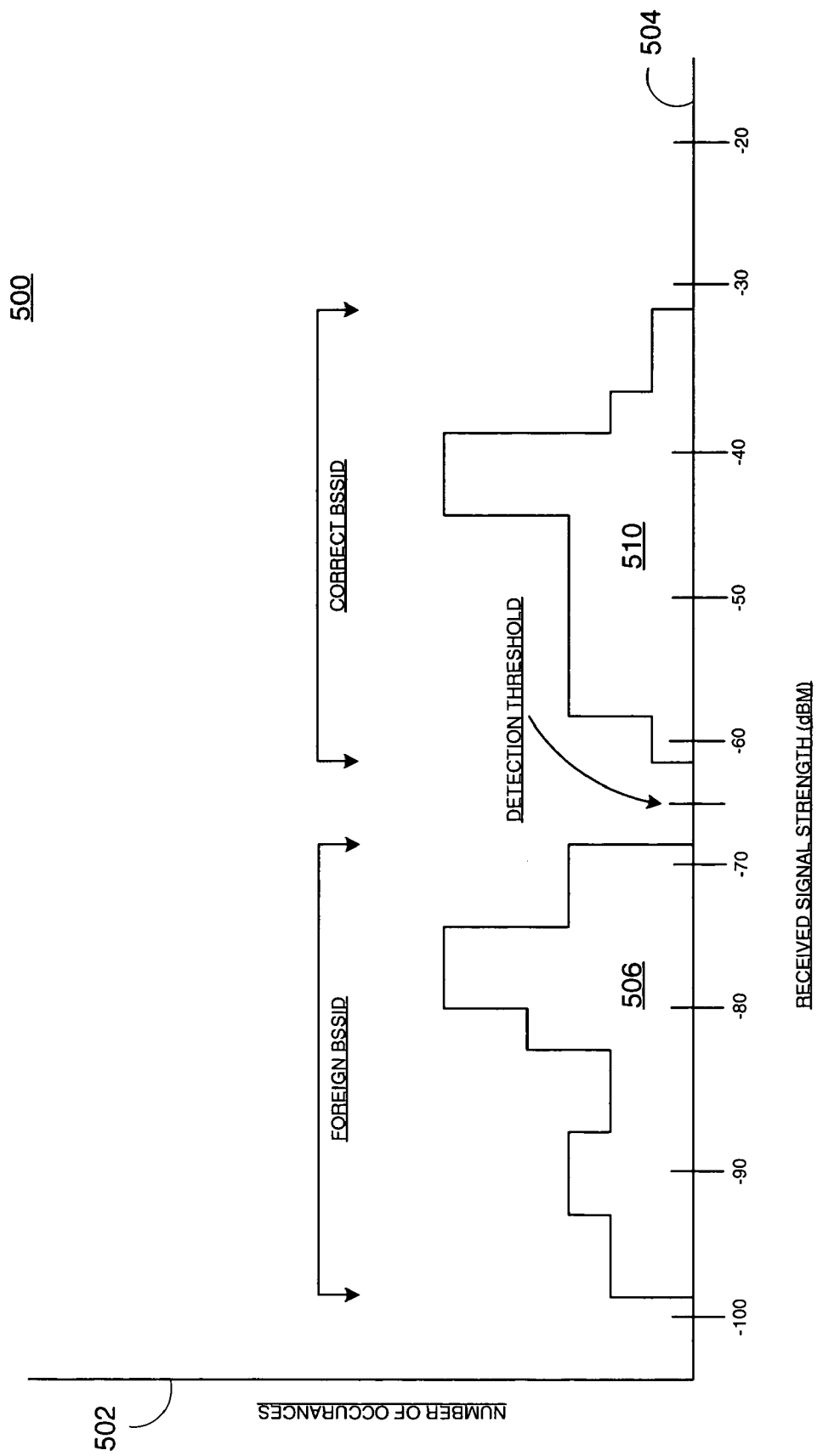
FIG. 5 is an example of a receive signal strength histogram graph for use with aspects of the present invention.

FIG. 5 is an example of a receive signal strength histogram graph 500 for use with aspects of the present invention. As shown in FIG. 5, the histogram graph 500 has a vertical axis 502 representing the number of occurrences and a horizontal axis 504 representing the received signal strength in dBm. Signal strength histograms 506 and 510 may be used in setting thresholds such as thres_62 data signal 340, data signal thr1 332, data signal thr1a 336, and others. Signal strength histograms 506 and 510 may be associated with their respective BSSIDs. For example, histogram 506 may represent the stored received power of some or all foreign (undesired) BSSIDs received signal strength. Histogram 510 may represent the received power of one or more correct (desired) BSSID received signal strengths. In this case, AGC/CCA 200 may use the stored histograms 506 and 510 to set the desired receiver sensitivity. For example, the stored histograms 506 and 510 may be used to set the threshold levels of data signal thr1a 336 for comparison to data signal raw_rssi 238. Further, the stored histograms 506 and 510 may be used to set the threshold levels of data signal thr1 332 for comparison to data signal cyc_rssi 236. Accordingly, receiver 100 may be set to a receiver threshold using the stored histograms 506 and 510 such that signals having undesired BSSIDs are rejected. In one aspect, the restart sequence described above may be combined with the threshold increase to allow the reception of weak or new members of the BSS whose signals fall below the CCI threshold. In one aspect of the present invention, based on the histograms 506 and 510, the AGC/CCA 200 may choose to ignore some or all packets from a foreign BSSID by setting all thr1a 336, thr1 332, thres_62 340 in between desired BSSID RSSIs and undesirable BSSID RSSIs, or even using a plurality of histogram data to generate a plurality of differing values of thr1a 336, thr1 332, thres_62 340 for correlated to a plurality of specific environments.

Generally in IEEE 802.11 networks, for example, all wireless devices are required to operate according to the distributed coordination function (DCF) rules. All wireless devices and access points operating under these rules must perform a clear channel assessment (CCA) before transmitting. CCA capture may result from one BSS waiting for signals intended for another BSS. Due to CCA capture, the information from BSSs operating on the same channel are shared between all of the wireless devices for both BSSs. In one aspect, given the received signal strengths represented by stored histograms 506 and 510, the receiver 100 may be decreased in sensitivity sufficiently to reduce CCA capture. Thus, the CCA threshold may be set great enough to allow BSSs to transmit on top of signals originating within an undesired BSS.

Figure 6:
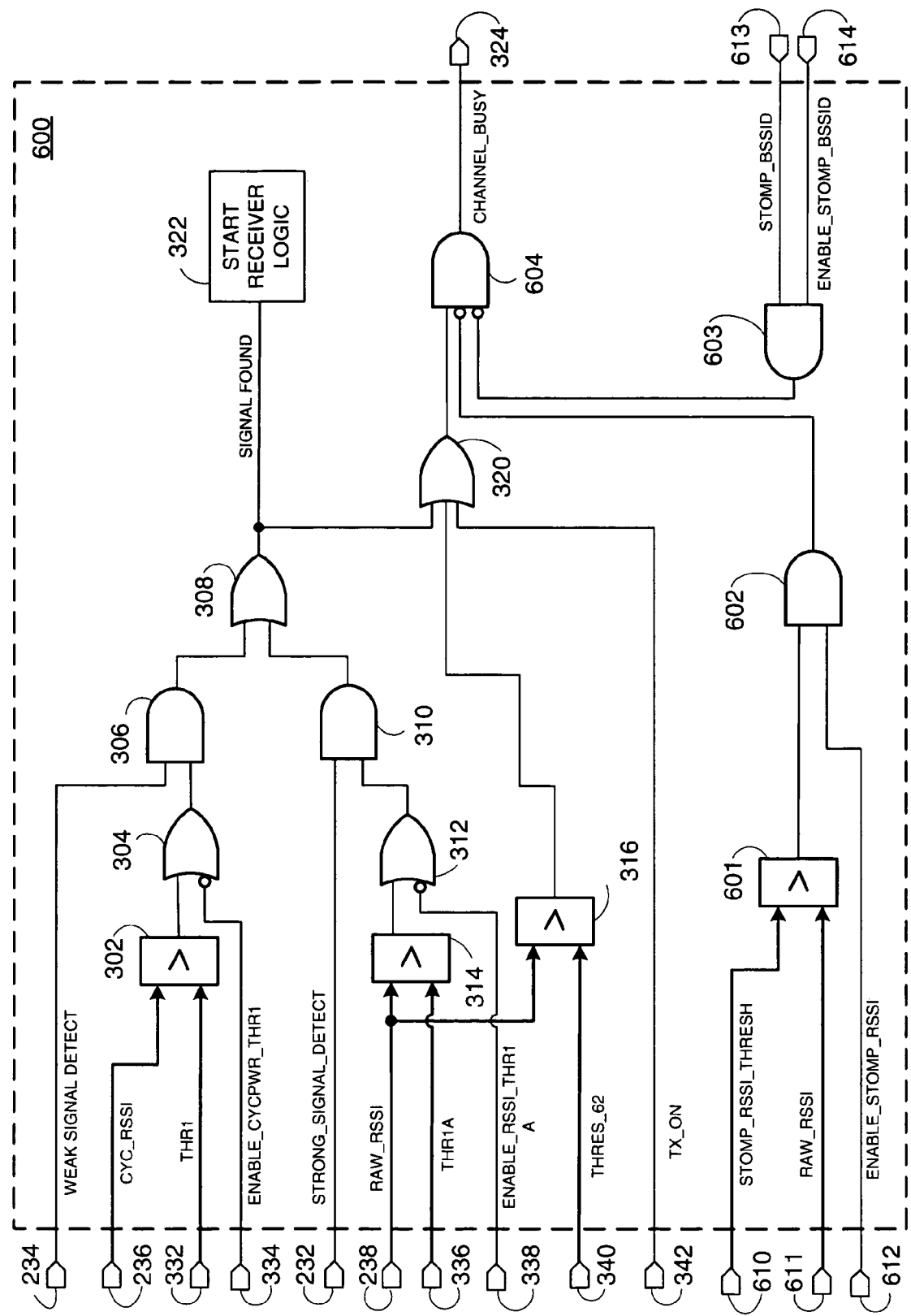
FIG. 6 illustrates a high-level schematic diagram of one embodiment of a signal detection circuit as in FIG. 3, also including the circuitry enabling the transmission of packets despite the presence of another signal, in accordance with one or more aspects of the present invention.

FIG. 6 illustrates a high-level schematic diagram 600 of one embodiment of a signal detection circuit as in FIG. 3, also including the circuitry enabling the transmission of packets despite the presence of another signal, in accordance with one or more aspects of the present invention. Transmission is enabled by holding channel_busy 324 low, in which case the transmitter will not defer to the present signal on the medium if a packet becomes ready for transmission. Comparator 601 compares the detected power of the incoming packet (RAW_RSSI) 611 to stomp_RSSI_thresh 610, a programmable threshold at which a packet might be considered too weak to have emanated from within the device's local BSS. If RAW_RSSI 611 is below stomp_RSSI_thresh 610, then the output of comparator 601 is true. If enable_stomp_RSSI 612 at the input of AND gate 602 is true, the channel busy_signal 324 will be suppressed by AND gate 604, allowing the device to transmit.

Similarly, if the signal reception and decoding block 150 determines that the incoming packet has a foreign BSSID, then stomp_BSSID 613 can be asserted. If enable_stomp_BSSID 614 is true, this signal will pass through AND gate 603, suppressing channel_busy 324 at the output of AND gate 604. Other identifying packet characteristics may be similarly processed to permit suppression of the channel_busy 324 signal.

It may be desirable to ensure that some packets from other BSSIDs are completely received. For example, request to send (RTS) and clear to send (CTS) control packets are specifically designed for avoiding collisions in the case of co-channel overlapping BSSs. Beacons are examples of management packets that may also serve to coordinate operation between co-channel overlapping BSSs. The beacons may contain information about contention free periods during which no devices should transmit in either overlapping BSS unless specifically polled by an AP. In both cases it could be detrimental to drop or transmit on top of control or management packets. Thus, for example, the stomp_BSSID 613 signal may be gated within the signal reception and decoding block 150 depending on a determination of packet type, such as a control or management frame. In this case, only data packets of type data would be candidates for termination or transmitting over.

Each of the approaches presented have their advantages and application. In many cases, adjusting the signal strength thresholds to ignore packets that come from co-channel BSSs realizes a significant improvement in throughput. This is because the channel is not indicated as busy and the receiver is not occupied for the amount of time it takes to determine a packet characteristic, such as the BSSID. However, this method may ignore weak packets that are coming from devices within the BSS that are further away. Terminating reception early on packets from foreign BSSIDs (drop_BSSID) may allow power dissipation savings in the receiver, and may allow the receiver to detect and begin reception of a weaker signal that is emanating from a device within its own BSS. Allowing transmissions on top of certain packets (stomping) allows at least a strong packet to be received, avoiding resending two packets and thus improving net throughput.

Further, application of individual techniques described herein or a combination of such techniques may further optimize performance by, for example, selecting a lower receive threshold and using a stomp-on-foreign-BSSID process for a mobile device that is distant from its associated BSS, permitting it to transmit even in the presence of equal or stronger signals from an interfering BSS. Further still, the AP associated with the distant mobile device may select a lower receive threshold and use the partial-decode, selective drop and receiver restart technique to increase the probability of receiving a weak signal, even in the face of equal or stronger CCI. Finally, applying drop or stomp on the basis of the packet's BSSID (rather than receive signal strength) allows the reception of very weak packets, in the case that there are devices within the desired BSS that are distant, while some devices in the co-channel overlapping BSS are closer and therefore stronger in signal strength.

While the present invention has been particularly described with reference to specific embodiments thereof, it should be readily apparent to those of ordinary skill in the art that other and further embodiments of the invention may be devised without departing from the basic scope thereof. It is intended that the appended claims include such changes and modifications.

What is claimed is:

1. A method of selectively disregarding co-channel signals in a communications network, the method comprising the steps of:

initiating a search sequence for a signal with a packet thereon;
   receiving the signal;
   processing the received signal;
   detecting an in-band signal from the processed signal; and
   setting an enable restart circuit that responds to a positive in-band power change of the in-band signal and an enable power drop circuit that responds to a negative in-band power change of the in-band signal,
   wherein the enable restart circuit and the enable power drop circuit are configured to abort the in-band signal based on inputs to the enable restart circuit and the enable power drop circuit.

2. The method according to claim 1, wherein processing the received signal includes:
   determining a power level of the received signal; and
   converting the received signal to a digital signal with a digital packet thereon.

3. The method according to claim 2, wherein processing the received signal further includes:
   performing a quick-drop gain control procedure if the power level of the received signal is above a saturation limit; and
   performing a coarse gain drop procedure if the power level of the received signal is within a defined range.

4. The method according to claim 2, wherein determining the power level includes determining an in-band power level.

5. The method according to claim 4, wherein determining the in-band power level includes determining a digital packet power of at least a portion of the digital packet.

6. The method according to claim 5, wherein measuring the digital packet power includes measuring a digital preamble power of at least a portion of a digital preamble of the digital packet.

7. The method according to claim 4, wherein processing the received signal further includes filtering the digital signal to provide a filtered digital signal with a filtered digital packet thereon.

8. The method according to claim 7, wherein determining the in-band power level includes determining a filtered digital signal power level of the filtered digital signal.

9. The method according to claim 8, wherein determining the filtered digital signal power level includes measuring a filtered digital packet power of at least a portion of the filtered digital packet.

10. The method according to claim 9, wherein measuring the filtered digital packet power includes measuring a filtered digital preamble power of at least a portion of a filtered digital preamble of the filtered digital packet.

11. The method according to claim 4, wherein detecting the in-band signal includes identifying a drop in receiver gain resulting from a strong in-band power level.

12. The method according to claim 11, wherein the drop in receiver gain is a quick-drop if the strong in-band power level exceeds a saturation limit.

13. The method according to claim 11, wherein the drop in receiver gain is a coarse gain drop if the strong in-band power is within a defined range.

14. The method according to claim 4, wherein detecting the in-band signal includes:
    identifying an increase in the in-band power level that is proportional to an increase in the power level; and
    recognizing a correlation exceeding correlation thresholds.

15. The method according to claim 14, wherein the correlation is cross-correlation.

16. The method according to claim 14, wherein the correlation is self-correlation.

17. The method according to claim 16, wherein detecting the in-band signal further includes, before the step of recognizing and after the step of identifying, filling an entire self-correlation viewing window.

18. A system for selectively disregarding signals operating on a common channel, comprising:
    a circuit adapted to receive a signal with a packet thereon, and further adapted to convert the signal to a digital signal;
    a filter section coupled to the circuit, that includes one or more filters that pass frequency components of the digital signal within a desired band of frequencies to obtain a filtered digital signal;
    one or more power detectors coupled to the filter section, for measuring an in-band power of the filtered digital signal; and
    control logic configured to execute a signal reception sequence if the in-band power levels of the filtered digital signal exceed one or more threshold values,
    wherein the control logic includes an enable restart circuit that responds to a positive in-band power change of the filtered digital signal and an enable power drop circuit that responds to a negative in-band power change of the filtered digital signal,
    wherein the enable restart circuit and the enable power drop circuit are configured to abort the filtered digital signal based on inputs to the enable restart circuit and the enable power drop circuit.

19. The system of claim 18, wherein the one or more filters includes a finite impulse filter.

20. The system of claim 18, wherein the one or more filters includes a decimation filter.

21. The system of claim 18, wherein the one or more filters includes a low pass filter.

22. The system of claim 18, wherein the one or more power detectors include:
    a first power detector for measuring the in-band power of a first filtered digital signal; and
    a second power detector for measuring the in-band power of a second filtered digital signal.

23. The system of claim 18, wherein the control logic includes a means for determining whether the one or more threshold values are exceeded.

24. The system of claim 18, wherein the control logic includes a means for filtered signal detection that compares the in-band power of the filtered digital signal to a filtered digital signal power threshold value.

25. The system of claim 18, further including a power storage means for storing the in-band power of the filtered digital signal.

26. The system of claim 25, wherein the power storage means is a register configured to store a power profile of at least a portion of a preamble of the filtered digital signal.

27. A system of selectively disregarding co-channel signals in a communications network, the system comprising:
    means for receiving a signal with a packet thereon;
    means for processing the received signal;
    means for detecting an in-band signal from the processed signal;
    means for activating a signal reception sequence for the detected in-band signal; and
    means for selectively responding to positive and negative in-band power changes of the in-band signal, wherein the means for selectively responding is configured to abort the in-band signal based on configurable inputs.

28. The system according to claim 27, wherein the means for processing the received signal includes:
    means for determining a power level of the received signal; and
    means for converting the received signal to a digital signal with a digital packet thereon.

29. The system according to claim 28, wherein the means for processing the received signal further includes:
    means for performing a quick-drop gain control procedure if the power level of the received signal is above a saturation limit; and
    means for performing a coarse gain drop procedure if the power level of the received signal is within a defined range.

30. The system according to claim 28, wherein the means for determining the power level includes a means for determining an in-band power level.

31. The system according to claim 30, wherein the means for processing the received signal further includes a means for filtering the digital signal to provide a filtered digital signal with a filtered digital packet thereon.

32. The system according to claim 30, wherein the means for detecting the in-band signal includes a means for identifying a drop in receiver gain resulting from a strong in-band power level.

33. The system according to claim 32, wherein the drop in receiver gain is a quick-drop if the strong in-band power level exceeds a saturation limit.

34. The system according to claim 32, wherein the drop in receiver gain is a coarse gain drop if the strong in-band power is within a defined range.

35. The system according to claim 30, wherein the means for detecting the in-band signal includes:
    means for identifying an increase in the in-band power level that is proportional to an increase in the power level; and
    means for recognizing a correlation exceeding correlation thresholds.

36. The system according to claim 27, wherein the means for selectively responding includes:
    means for aborting the signal reception sequence if a new signal is detected, wherein the new signal is stronger than the detected in-band signal; and
    means for returning to the step of receiving the signal for the new signal.

37. The system according to claim 27, wherein the means for selectively responding includes:
    means for aborting the signal reception sequence if a new signal is detected, wherein the new signal is stronger than the detected in-band signal by at least a threshold amount; and
    means for returning to the step of receiving the signal for the new signal.

38. The system according to claim 27, wherein the means for selectively responding includes:
    means for aborting the signal reception sequence if a decrease in an in-band power measurement of the in-band signal exceeds a delta power decrease limit; and
    means for returning to the step of initiating the search sequence.

39. The system according to claim 27, wherein the means for processing includes:
  means for suppressing a channel busy signal if the in-band signal is determined to have at least one undesirable characteristic; and
  means for returning to the step of initiating the search sequence.

40. The system according to claim 39, wherein the at least one undesirable characteristic includes one or more of an address and a BSSID.

41. The system according to claim 39, wherein the means for aborting is only applied to the in-band signal having packets of predetermined type.

42. The system according to claim 39, wherein the means for suppressing is applied to the in-band signal regardless of packet type.

\* \* \* \* \*